United States Patent [19]
Crumly et al.

[11] Patent Number: 5,245,750
[45] Date of Patent: Sep. 21, 1993

[54] METHOD OF CONNECTING A SPACED IC CHIP TO A CONDUCTOR AND THE ARTICLE THEREBY OBTAINED

[75] Inventors: William R. Crumly, Anaheim; Haim Feigenbaum, Irvine, both of Calif.

[73] Assignee: Hughes Aircraft Company, Los Angeles, Calif.

[21] Appl. No.: 843,128

[22] Filed: Feb. 28, 1992

[51] Int. Cl.$^5$ .................... H05K 3/34; H05K 1/00
[52] U.S. Cl. ........................ 29/840; 174/260; 228/180.22; 361/777; 437/183
[58] Field of Search .............. 29/846; 228/180.2; 361/398, 414; 174/260; 437/183

[56] References Cited

U.S. PATENT DOCUMENTS

| | | | |
|---|---|---|---|
| 4,403,272 | 9/1983 | Larson et al. | 361/398 |
| 4,835,859 | 6/1989 | Beckett | 29/846 |
| 5,014,111 | 5/1991 | Tsuda et al. | 437/183 X |
| 5,027,995 | 7/1991 | Karl et al. | 228/180.2 X |
| 5,121,299 | 6/1992 | Frankeny et al. | 361/414 X |

Primary Examiner—Carl J. Arbes
Attorney, Agent, or Firm—Elizabeth E. Leitereg; Terje Gudmestad; Wanda K. Denson-Low

[57] ABSTRACT

An integrated circuit chip (26, 34) is connected to a circuit trace by providing a raised feature on a circuit trace (17, 28) which is coated with a material capable of forming an electrical connection (23, 32), as well as an attachment when the pad (25, 33) of an integrated circuit chip (26, 34) is brought into engagement with it. This material may be solder (23) or it may be a Z-axis adhesive (32) which becomes conductive at areas where it is compressed. The raised feature or bump (18, 31) on the circuit trace (17, 28) may be produced by providing a mandrel (10) having a recess (12) complementary to the raised feature (18, 31) to be provided, and suitably plating the circuit trace (17, 28) on the mandrel (10) including the recessed area (12). Upon subsequent lamination of a dielectric layer (19, 30) and removal from the mandrel (10), there is produced a circuit trace (17, 28) on a dielectric with a raised feature (18, 31) which can be used to attach to an integrated circuit chip (26, 34).

18 Claims, 2 Drawing Sheets

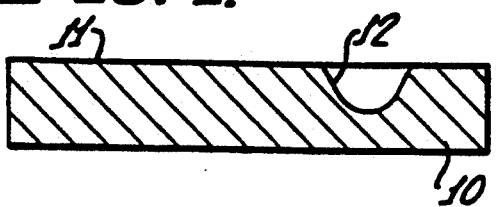
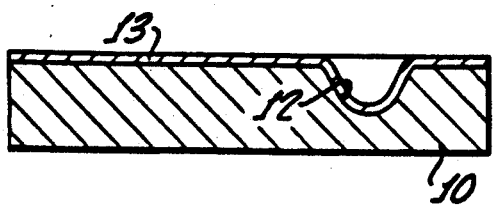
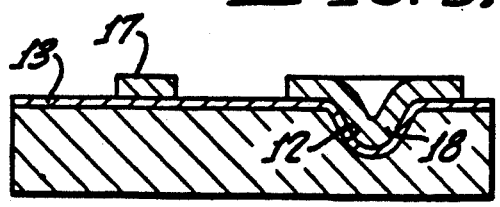
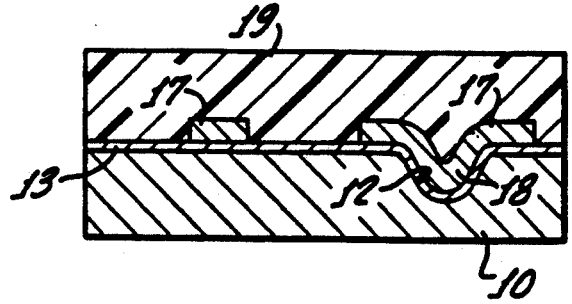
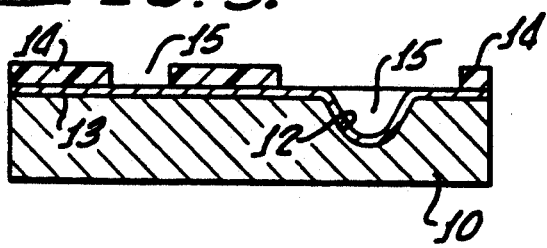
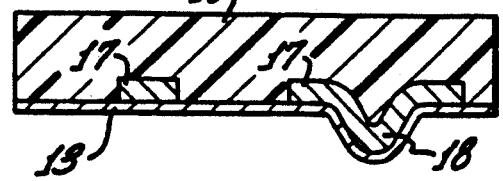
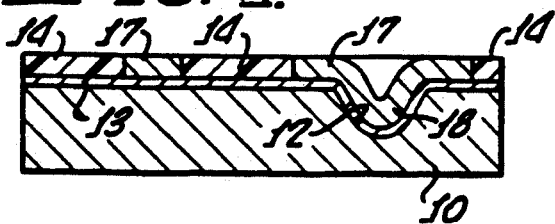

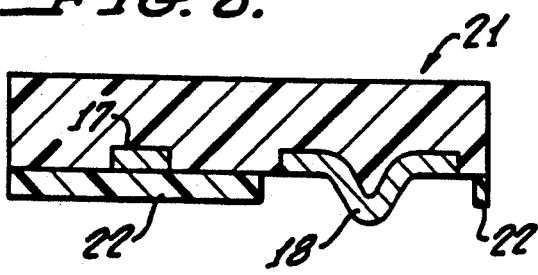
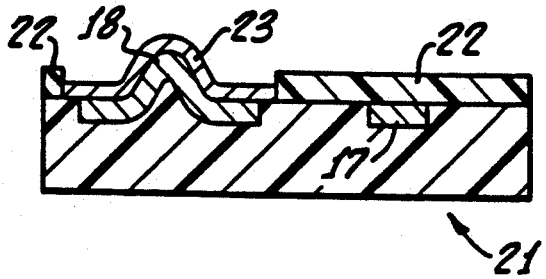
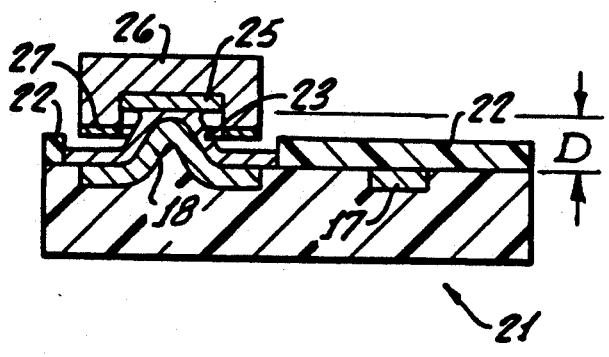
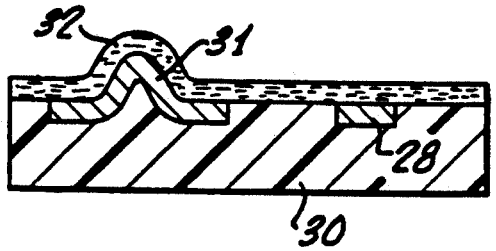
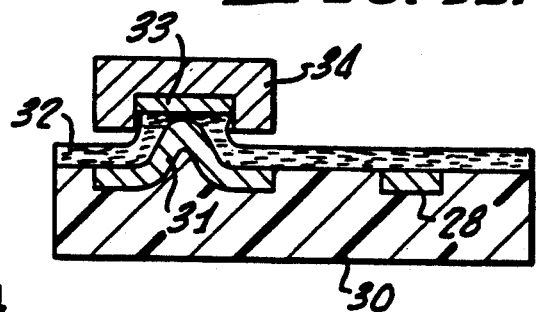
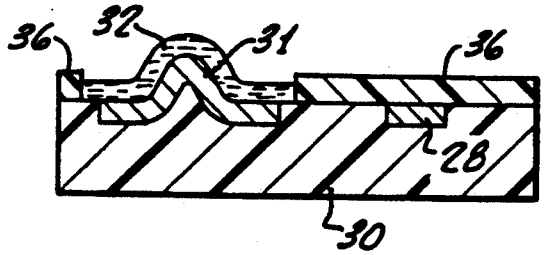

METHOD OF CONNECTING A SPACED IC CHIP TO A CONDUCTOR AND THE ARTICLE THEREBY OBTAINED

BACKGROUND OF THE INVENTION

1. Field of the Invention

This invention pertains to the connection of integrated circuit chips in an electrical circuit.

2. Description of Related Art

Conventional techniques for attaching integrated circuit chips to circuit traces on a printed circuit board or flexible conductor take up a considerable amount of space so that the chips cannot be positioned as close to each other as desired for many installations. A high density of chips may be essential in an increasing number of electrical circuits. In conventional chip attachment a chip is positioned on a substrate with its pads facing outwardly and wires are extended between the pads of the chip and the circuit traces or pads on the substrate. Obviously, space must be provided around the chip to accommodate the connecting wires.

In order to alleviate this problem what is known as the flip chip or controlled collapse chip connection has been devised. In this arrangement, solder bumps are plated onto the pads of the integrated circuit chip. The chip then is inverted with its pads positioned over and pressed against the circuit traces. Upon melting and fusion of the solder, connections can be achieved.

This successfully increases the permissible density of the chips on a substrate, but has serious drawbacks. Unless all of the solder bumps on the chip properly engage the corresponding circuit traces, a solder joint will not be achieved. When this occurs, it becomes necessary to scrap the part. The solder bumps are destroyed upon heating and cannot be reworked. For multichip modules it may then become necessary to discard a very expensive component which has had a number of prior operations performed on it before the attempted connection of the chip. Inasmuch as it is impossible to achieve complete assurance that all of the chips will bond properly in the normal flip chip operation, the expense may become prohibitive for multichip modules.

Also, it is necessary to apply the solder to the chip at wafer level of fabrication. Not all chip manufacturers are willing to supply chips with solder bumps, and some manufacturing methods preclude solder bumps at all. Thus only a limited number of chips are available for flip chip. To use flip chip methods, all the chips on a module should be attached via flip chip. If some of the chips are not available with solder bumps, then it may not be economical to use flip chip processing at all.

Similar problems are encountered when posts are formed on the chip pad or when bumps are provided with tape automated bonding.

SUMMARY OF THE INVENTION

In accordance with the present invention, bumps are provided on the circuit traces to which the chips are to be attached and not upon the pads of the chips. The inverted chips are then joined to the circuit traces at the bumps. Under this system, the bumps may be created with great accuracy of dimension, reducing the possibility that the bump will not do its job. The bumps provided are relatively strong so that they are not destroyed when steps are taken to attach to the pad on the chip. Hence, rework is accomplished easily.

In accordance with this invention, a circuit trace on a dielectric substrate may be prepared generally in the manner set out in patent application Ser. No. 07/753,400, for SEMI-ADDITIVE CIRCUITRY WITH RAISED FEATURES USING FORMED MANDRELS, filed Aug. 30, 1991, by William R. Crumly, Christopher M. Schreiber and David B. Swarbrick. Alternatively, this can be accomplished as disclosed in patent application Ser. No. 07/580,758 for THREE-DIMENSIONAL ELECTROFORMED CIRCUITRY, filed Sep. 11, 1990, by William R. Crumly, Christopher M. Schreiber and Haim Feigenbaum. Both of these applications are assigned to the assignee of the present application. The disclosures of these prior applications are incorporated by reference as though fully set forth herein.

In a preferred arrangement, a mandrel is provided which includes a flat surface in which is formed a depression or recess which has a contour complementary to that of a raised feature to be produced. A flash copper plating is applied over the mandrel surface including the surface of the recess. After this, a photoresist, which is the negative of a circuit to be produced, is applied over the flash copper plating and copper is electroplated into the spaces in the photoresist to result in an electrical circuit. The resist then is removed, a dielectric layer is laminated over the copper and the assembly is separated from the mandrel. The flash copper layer then is etched away to leave a completed circuit on a dielectric substrate.

In accordance with the present invention, a material is provided on the raised features or bumps which can both attach to an integrated circuit pad and also provide electrical conductivity. This may be tin-lead which is reflowed to a solder alloy. Prior to electroplating the solder on the raised feature or bump, a solder mask may be applied over the surface of the assembly leaving localized openings where the solder is to be applied. The integrated circuit then is pressed against the bump and, upon the application of heat, a fused solder joint is achieved.

Instead of electroplating the solder, it may be applied by dipping the assembly into a bath of solder and then blowing away the excess solder from locations other than at the exposed bumps. Various kinds of solder may be employed.

In an alternative arrangement, a Z-axis conductive adhesive is applied on the exposed bumps instead of solder. This type of adhesive contains metal particles which, upon compression, become interengaged so as to create an electrical conductor. The chip is pressed down onto the bump to which the adhesive has been applied so that upon curing of the adhesive there will be an electrical connection at the pad and a bonding, as well.

BRIEF DESCRIPTION OF THE DRAWINGS

In the accompanying drawings:

FIGS. 1 through 10 are sectional views that illustrate a sequence of steps in the preparation of circuit traces on a substrate and the attachment of an integrated circuit chip in accordance with this invention;

FIGS. 11 and 12 illustrate an alternative attachment through the use of a conductive adhesive; and FIG. 13 is a view of a variation of the attachment by an adhesive.

DETAILED DESCRIPTION OF THE PREFERRED EMBODIMENT

In attaching an integrated circuit chip in an electrical circuit in accordance with this invention there are first provided raised features on a substrate. This may be accomplished through the use of a mandrel 10 of stainless steel, having a flat upper surface 11, as seen in FIG. 1. At least one localized depression 12 is formed in the surface 11 and made complementary to the raised feature that is to be provided. The recess 12 is illustrated as dome-shaped but it may be given any desired contour.

Next, there is provided over the surface 11 and within the recess 12 a continuous copper coating 13, as shown in FIG. 2. This is a thin electroplated flash coating of a thickness of about 0.2 mil.

After this, a photoresist 14 is applied over the flash coating 13, leaving spaces 15 which correspond to an electrical circuit to be produced. The spaces 15 include the recess 12.

Then, copper is electroplated in the spaces 15 over the flash coating 13 (FIG. 4). The result is to provide circuit trace 17 as well as what will become a raised feature or bump 18 at the recess 12. The photoresist 14 then is stripped away, leaving only the electroplated circuit traces 17 and the bump or raised feature 18, as well as the flash copper plating 13, on the mandrel 10 (FIG. 5).

After this, a dielectric layer 19 is laminated to the circuit traces 17, raised feature 18 and the exposed flash copper plating 13 on the mandrel 10 as seen in FIG. 6. The dielectric layer 19 may be, for example, a Kapton and adhesive, laminated under elevated temperature and pressure conditions so that the adhesive will flow around the circuit traces and the raised features covering their exposed sides.

The assembly 21 of the dielectric layer along with the electroplated copper 17 and 18 and the flash copper layer 13 then is removed from the mandrel 10 (FIG. 7). This separation is made possible by the flash copper layer 13 which does not permanently adhere to the surface of the stainless steel mandrel 11. Otherwise, the dielectric layer of Kapton and adhesive would become bonded to the mandrel and could not be removed.

The next step is to flash-etch the assembly to remove the thin copper layer 13. A solder mask 22 (or photoresist) then is applied over the surface of the assembly 21, as shown in FIG. 8, covering all but the area around the bump or raised feature 18. A tin-lead composition 23 then is electroplated over the bump 18 as illustrated in FIG. 9, onto the portions of copper traces exposed by openings in the solder mask or photoresist 22. Following this, the fusible tin-lead layer is reflowed under heat to produce a solder alloy.

The bump 18 then is ready for attachment to the pad 25 of a chip 26. As seen in FIG. 10, the pad 25 is recessed but nevertheless is readily engaged by the projecting bump 18. That is, the bump 18 substantially bridges the separation distance "D" between the upper plane of the traces 17 on substrate 19, and the pad 25 on chip 26. When heated with the chip pressed against the bump 18, a soldered connection is made between the bump 18 and the pad 25.

A passivation layer 27 also may be included under the chip 26.

The plated tin-lead material 23 may be reflowed to a solder alloy simultaneously with the attachment of the chip, rather than as a separate step. Other kinds of solder also may be used.

The bumps on the substrate may be attached to the pads on the chip by a Z-axis conductive adhesive, which is available as a liquid or a film, rather than solder. Such an anisotropically electrically conductive adhesive is available from several sources.

As shown in FIG. 11, a circuit trace 28 is provided on a substrate 30 with a bump 31 being formed in a suitable manner, such as that described above. When the pitch of the chip pads is small, a Z-axis conductive adhesive 32 is applied as a liquid over the entire exposed surface of the assembly. Alternatively, the pad 33 of the chip 34 may be coated. A chip 34 then is pressed against the assembly so that the pad 33 of the chip bears against the adhesive 32 on the bump 31 as the adhesive is cured. With the chip 34 being forced toward the bump 31, compression of the Z-axis adhesive 32 will occur only at the point of engagement of the chip, namely, at the pad 33. The remainder of the adhesive 32 is not compressed. As a result, the Z-axis adhesive 32 becomes conductive at the bump 31, but remains nonconductive elsewhere. Consequently, a circuit is completed between the chip 34 and the circuit traces 28.

When there is lesser density of the chip pads, a coverlay 36 may be applied over the assembly, as seen in FIG. 13, leaving the bump 31 exposed. The Z-axis adhesive 32 then is applied only at the exposed bump 31 to avoid using excess adhesive. The chip then is pressed against the exposed bump, as described above, compressing the adhesive only at that localized area to both attach the chip to the circuit and to produce an electrical connection.

What is claimed is:

1. A device for attaching an integrated circuit chip to an electrical circuit which is spaced from said integrated circuit chip to define a separation distance comprising:
    a dielectric substrate,
    at least one circuit trace on said substrate, said circuit trace including a raised feature projecting outwardly from said circuit trace and from said dielectric substrate and into said separation distance, and
    a material on said circuit trace remote from said raised feature and on said raised feature, said material being compressed between only a connector pad of said integrated circuit chip and said raised feature, said compressed material forming an electrical connection between said connector pad and said raised feature.

2. A device as recited in claim 1 in which said material is a fusible material.

3. A device as recited in claim 1 in which said material is a Z-axis conductive adhesive.

4. In combination with an integrated circuit chip having a pad for connection to an electric circuit, an electrical circuit device comprising:
    a dielectric substrate,
    at least one circuit trace on said substrate defining a separation distance with said circuit chip, said circuit trace including a raised feature projecting outwardly from said circuit trace and from said substrate and into said separation distance, said chip being positioned such that said pad is adjacent said raised feature and does not engage other portions of said circuit trace, and
    a material on said circuit trace remote from said raised feature and on said raised feature, said material being compressed between said pad and said raised feature which provides an electrical connection only between said pad and said raised feature and attaches said integrated circuit chip to said electric circuit.

5. A device as recited in claim 4 in which said material is solder.

6. A device as recited in claim 5 in which said material is a Z-axis conductive adhesive.

7. A method of electrically connecting a conductor to an integrated circuit chip spaced from said conductor in order to define a separation distance between said conductor and said chip, said chip having a connector pad comprising the steps of:
   forming a circuit trace on a dielectric substrate such that said circuit trace includes at least one raised feature projecting from said circuit trace;
   positioning said integrated circuit chip so that its connector pad confronts said raised feature and said raised feature projects into said separation distance; and
   securing said connector pad to said raised feature by a conductive material interposed between said connector pad and said raised feature, said step of securing comprising the steps of:
      applying a Z-axis electrically conductive adhesive to portions of said circuit trace including said raised feature,
      compressing said Z-axis conductive adhesive between said integrated circuit chip and said raised feature and
      curing said compressed Z-axis conductive adhesive to bond said connector pad to said raised feature and to cause said Z-axis conductive adhesive to become electrically conductive only at said raised feature.

8. The method as recited in claim 7 in which said Z-axis conductive adhesive is applied only to said raised feature, and an overlay is applied over other portions of sad circuit trace.

9. The method as recited in claim 7 wherein said step of forming a circuit trace on a dielectric substrate comprises forming a mandrel having a recess therein, forming said circuit trace on said mandrel and said raised feature in said recess, laminating a dielectric substrate material to said circuit trace so formed, and removing said dielectric material and said circuit trace including said raised feature from said mandrel and said recess.

10. The method as recited in claim 9 in which said circuit trace is formed by electroplating.

11. The method as recited in claim 9 in which for forming said circuit trace a resist is photolithographically formed over said coating except for spaces where said circuit trace is to be formed, copper material is electroplated onto said mandrel at said spaces, and then said resist is removed.

12. A method of electrically connecting a conductor to an integrated circuit chip spaced from said conductor in order to define a separation distance between said conductor and said chip, said chip having a connector pad comprising the steps of:
   forming a circuit trace on a dielectric substrate such that said circuit trace includes at least one raised feature projecting from said circuit trace;
   positioning said integrated circuit chip so that its connector pad confronts said raised feature and said raised feature projects into said separation distance; and
   securing said connector pad to said raised feature by a conductive material interposed between said connector pad and said raised feature,
   wherein said step of forming a circuit trace on a dielectric substrate comprises the steps of:
      forming a mandrel having a recess therein,
      forming said circuit trace on said mandrel and said raised feature in said recess,
      laminating a dielectric substrate material to said circuit trace so formed, and
      removing said dielectric material and said circuit trace including said raised feature from said mandrel and said recess, and
   wherein said step of forming a mandrel comprises the step of applying to said mandrel a coating of a material capable of separation therefrom.

13. The method as recited in claim 12 wherein said step of securing said connector pad to said raised feature comprises the steps of;
   coating said raised feature with a fusible material,
   bringing said connector pad into engagement with said coated raised, and
   heating said fusible material to effect said attachment between said raised feature and said pad.

14. The method as recited in claim 13 wherein said step of coating said raised feature with a fusible material comprises the step of coating said raised feature with tin-lead, and said step of heating said fusible material comprises the step of reflowing said tin-lead to become a solder alloy.

15. The method as recited in claim 13 wherein said step of coating said raised feature with a fusible material comprises the step of applying a solder mask to said dielectric substrate and said circuit trace to cover the same remote from said raised feature while leaving said raised feature exposed for engagement with said connector pad.

16. A method of electrically connecting a conductor to an integrated circuit chip spaced from said conductor in order to define a separation distance between said conductor and said chip, said chip having a connector pad comprising the steps of:
   forming a circuit trace on a dielectric substrate such that said circuit trace includes at least one raised feature projecting from said circuit trace;
   positioning said integrated circuit chip so that its connector pad confronts said raised feature and said raised feature projects into said separation distance; and
   securing said connector pad to said raised feature by a conductive material interposed between said connector pad and said raised feature,
   wherein said step of forming a circuit trace on a dielectric substrate comprises the steps of:
      forming a mandrel having a recess therein,
      forming said circuit trace on said mandrel and said raised feature in said recess,
      laminating a dielectric substrate material to said circuit trace so formed, and
      removing said dielectric material and said circuit trace including said raised feature from said mandrel and said recess;
   wherein said step of forming a mandrel having a recess comprises the step of providing a thin coating of copper on said mandrel, said step of laminating a dielectric substrate material to said circuit trace comprises laminating said dielectric material to said circuit trace and said copper coating, and wherein said step of securing said connector pad to said raised feature comprises removing said copper coating from said raised feature prior to applying said conductive material between said connector pad and said raised feature.

17. The method as recited in claim 16 further including the step of forming said thin coating of copper on said mandrel by electroplating.

18. The method as recited in claim 16 further including the step of removing said thin coating from said raised feature by etching.

* * * * *